United States Patent
Sun et al.

(10) Patent No.: US 12,404,577 B2
(45) Date of Patent: Sep. 2, 2025

(54) METHOD AND APPARATUS FOR DEPOSITION OF PIEZO-ELECTRIC MATERIALS

(71) Applicant: Applied Materials, Inc., Santa Clara, CA (US)

(72) Inventors: Lizhong Sun, San Jose, CA (US); Xiao Dong Yang, Xi'an (CN)

(73) Assignee: APPLIED MATERIALS, INC., Santa Clara, CA (US)

(*) Notice: Subject to any disclaimer, the term of this patent is extended or adjusted under 35 U.S.C. 154(b) by 12 days.

(21) Appl. No.: 17/783,609

(22) PCT Filed: Dec. 31, 2019

(86) PCT No.: PCT/CN2019/130795
§ 371 (c)(1),
(2) Date: Jun. 8, 2022

(87) PCT Pub. No.: WO2021/134606
PCT Pub. Date: Jul. 8, 2021

(65) Prior Publication Data
US 2023/0009085 A1    Jan. 12, 2023

(51) Int. Cl.
*C23C 14/06* (2006.01)
*C23C 14/02* (2006.01)
(Continued)

(52) U.S. Cl.
CPC ........ *C23C 14/0617* (2013.01); *C23C 14/024* (2013.01); *C23C 14/345* (2013.01);
(Continued)

(58) Field of Classification Search
CPC ..... C23C 14/067; C23C 14/345; C23C 14/35; C23C 14/541; H10N 30/853; H10N 30/076; H01N 30/853; H01N 30/076
See application file for complete search history.

(56) References Cited

U.S. PATENT DOCUMENTS 6,171,641 B1 * 1/2001 Okamoto ............ C23C 16/4586
427/248.1
8,585,873 B2 * 11/2013 Ford .................... H01J 37/3455
204/192.12
(Continued)

FOREIGN PATENT DOCUMENTS

CN          1893265 A      1/2007
CN        100461630 C      2/2009
(Continued)

OTHER PUBLICATIONS

Machine Translation CN 106244984 (Year: 2016).*
(Continued)

*Primary Examiner* — Michael A Band
(74) *Attorney, Agent, or Firm* — Patterson + Sheridan, LLP

(57) ABSTRACT

Examples disclosed herein relate to an apparatus and method of forming thin film layers on a substrate. A first piezoelectric material layer is deposited on the substrate in a first chamber. The first piezoelectric material layer is formed on the substrate while the substrate is at a first temperature. A second piezoelectric material layer is deposited on the first piezoelectric material layer after cooling the substrate to a second temperature. The second temperature is lower than the first temperature. The first piezoelectric material layer and the second piezoelectric material layer both comprise a first piezoelectric material.

8 Claims, 8 Drawing Sheets

(51) Int. Cl.
    *C23C 14/34*     (2006.01)
    *C23C 14/35*     (2006.01)
    *C23C 14/54*     (2006.01)
    *H10N 30/076*     (2023.01)
    *H10N 30/853*     (2023.01)

(52) U.S. Cl.
    CPC ............ *C23C 14/35* (2013.01); *C23C 14/541* (2013.01); *H10N 30/076* (2023.02); *H10N 30/853* (2023.02)

(56) References Cited

U.S. PATENT DOCUMENTS

| | | | |
|---|---|---|---|
| 9,831,416 | B2 | 11/2017 | Umeda et al. |
| 12,029,129 | B2 * | 7/2024 | Sun ....................... C23C 14/564 |
| 2001/0008205 | A1 | 7/2001 | Wilke et al. |
| 2002/0008443 | A1 | 1/2002 | Yamada et al. |
| 2004/0135183 | A1 | 7/2004 | Matsuura et al. |
| 2009/0246385 | A1 | 10/2009 | Felmetsger et al. |
| 2016/0027962 | A1 | 1/2016 | Liao et al. |
| 2017/0294294 | A1 | 10/2017 | Haymore et al. |
| 2021/0249587 | A1 * | 8/2021 | Sun ....................... C23C 14/568 |
| 2021/0384412 | A1 * | 12/2021 | Trajcevski ............ C23C 14/025 |

FOREIGN PATENT DOCUMENTS

| | | |
|---|---|---|
| CN | 102122936 A | 7/2011 |
| CN | 103014654 A | 4/2013 |
| CN | 103924204 A | 7/2014 |
| CN | 106244984 A | 12/2016 |
| CN | 107689781 A | 2/2018 |
| CN | 109188407 A | 1/2019 |
| CN | 109778122 A | 5/2019 |
| JP | 2002217463 A | 8/2002 |
| JP | 2004214569 A | 7/2004 |
| JP | 2010171456 A | 8/2010 |
| JP | 2013044047 A | 3/2013 |
| JP | 2014084494 A | 5/2014 |
| JP | 2015529009 A | 10/2015 |
| JP | 2019145677 A | 8/2019 |
| WO | WO-2011002028 A1 * | 1/2011 ......... C23C 14/0036 |
| WO | 2018180276 A1 | 10/2018 |

OTHER PUBLICATIONS

Machine Translation WO 2011002028 (Year: 2011).*
International Search Report and Written Opinion dated Sep. 27, 2020, PCT/CN2019/130795.
EP Search Report dated Aug. 23, 2023 for Application No. EP19 95 8545.
Japanese Office Action dated Oct. 3, 2023 for Application No. 2022-539665.
Notice of Observation in JP Patent Application No. 2022-539665 dated Apr. 25, 2023.
Chinese Office Action dated Apr. 26, 2024 for Application No. 201980103376.6.
Korean Office Action dated May 7, 2024 for Application No. 10-2022-7026526.
Japanese Office Action dated Jul. 2, 2024 for Application No. 2022-539665.
Chinese Office Action dated Jan. 30, 2024 for Application No. 201980103376.6.
Korean Office Action dated Jan. 24, 2025 for Application No. 10-2022-7026526.

* cited by examiner

METHOD AND APPARATUS FOR DEPOSITION OF PIEZO-ELECTRIC MATERIALS

BACKGROUND

Field

Examples disclosed herein relate to an apparatus and method of forming thin film layers on a substrate.

Description of the Related Art

Thin film piezoelectric materials can be used in sensors and transducers. Piezoelectric sensors and transducers are also used in devices such as gyro-sensors, ink-jet printer heads and other Microelectromechanical systems (MEMS) devices, including acoustic resonator used in mobile phones and other wireless applications. These thin piezoelectric films can be fabricated by techniques such as sputtering, pulsed laser ablation (PLD), MOCVD, and sol-gel deposition.

In semiconductor processing, physical vapor deposition (PVD) (e.g., sputtering process) is a conventionally used process for depositing a thin film. A PVD process includes bombarding a target that has a source material. Ions are generated in a plasma within a chamber, causing the source material to be sputtered from the target to a substrate. During some PVD processes, the sputtered source material is then accelerated towards the substrate being processed via a voltage bias. The source material is deposited on the surface of the substrate. In some examples, the sputtered source material may react with another reactant. In the case of sputtering a fabricated layer on a substrate, epitaxial growth of the thin films can demonstrate strain and/or dislocated structure due to the thermal and lattice mismatch between the piezoelectric-based materials and the substrate.

During deposition of the sputtered material, a thickness and stress uniformity of the sputtered thin films may be affected by several controlled parameters. The controlled parameters can include a strength of a magnetic field used to trap electrons near the surface of a sputtering target, a lattice match or mismatch between adjacent materials, and crystal orientation of the substrate can make it difficult to maintain uniform properties of thin films. Such non-uniformity of thin films can reduce the quality and yield in device production of piezoelectric sensors and actuators.

Accordingly, there is a need for an improved method and apparatus for depositing quality piezoelectric materials and increasing the yield in producing sensing devices.

SUMMARY

Disclosed herein is an apparatus and method of forming thin film layers on a substrate. A first piezoelectric material layer is deposited on the substrate in a first chamber. The first piezoelectric material layer is formed on the substrate while the substrate is at a first temperature. A second piezoelectric material layer is deposited on the first piezoelectric material layer after cooling the substrate to a second temperature. The second temperature is lower than the first temperature. The first piezoelectric material layer and the second piezoelectric material layer both comprise a first piezoelectric material.

In another example, a method of processing a substrate in a cluster tool includes depositing a seed layer on a substrate in a first process chamber of the cluster tool by use of a physical vapor deposition process, and at a first temperature. The seed layer includes a first material. The substrate is cooled to a second temperature. The second temperature is below the first temperature. A first piezoelectric material layer is deposited on the seed layer by use of a physical vapor deposition process, after cooling the substrate to the second temperature. The first piezoelectric material layer includes the first material.

In another implementation, an apparatus for processing a substrate is disclosed. The apparatus includes a processor coupled to at least one non-transitory computer readable medium, wherein the at least one non-transitory computer readable medium includes instructions which when executed by the processor are configured to perform a method. The method includes depositing a first piezoelectric material layer on the substrate in a first chamber. The first piezoelectric material layer is formed on the substrate while the substrate is at a first temperature. The method further includes depositing a second piezoelectric material layer on the first piezoelectric material layer after cooling the substrate to a second temperature. The second temperature is lower than the first temperature. The first piezoelectric material layer and the second piezoelectric material layer both include a first piezoelectric material.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only examples and are therefore not to be considered limiting of its scope, and may admit to other equally effective examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
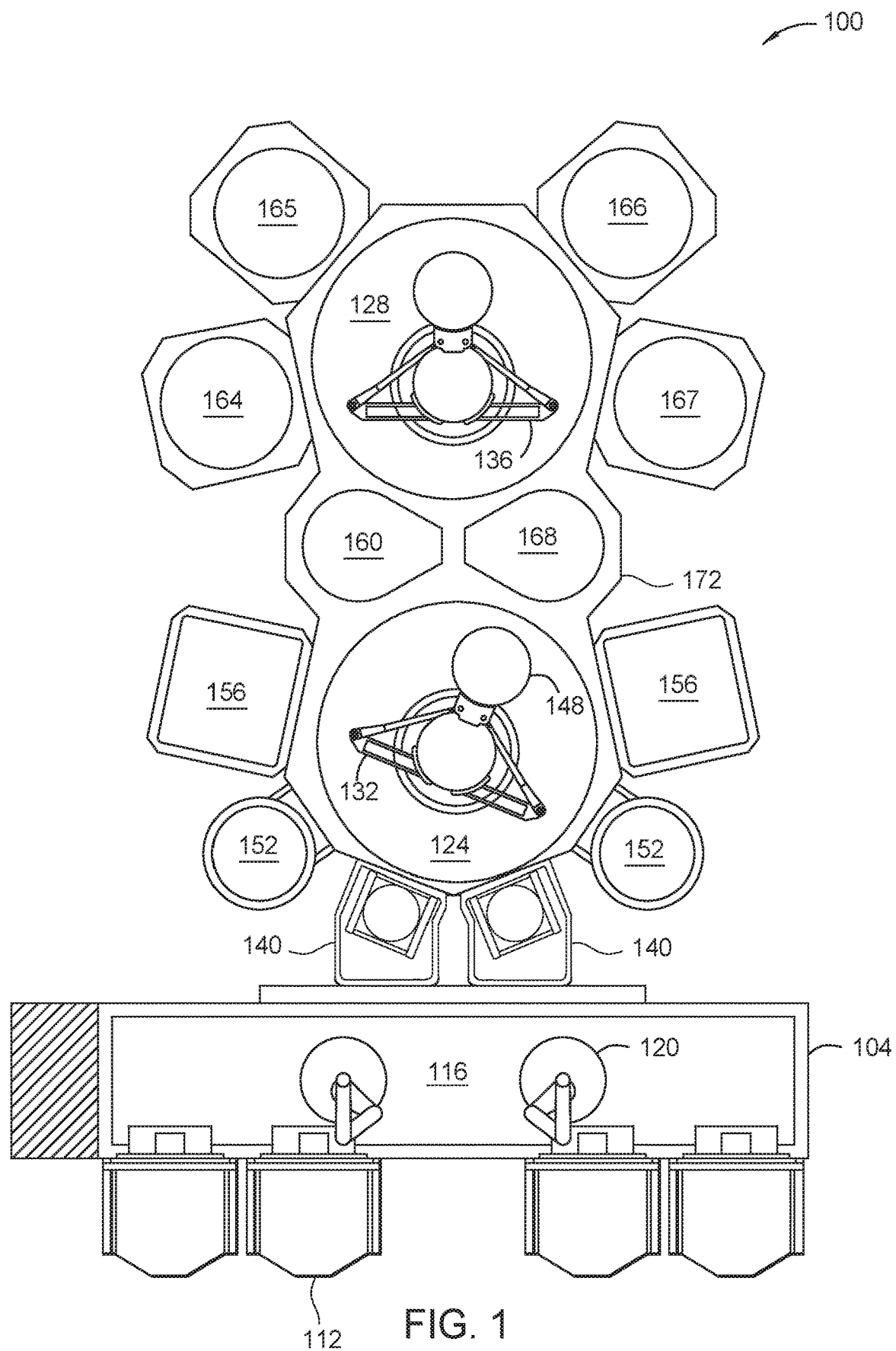
FIG. 1 is a plan view of a cluster tool that is adapted to deposit thin film layers on a substrate by use of one or more processing chambers, according to an embodiment described herein.

Disclosed herein is an apparatus and method of forming thin film layers on a substrate. In some embodiments, it has been found that when piezo-electric materials are deposited on a substrate at high temperatures, the variation in the crystal orientation in the deposited film is improved, resulting in narrower full-width-half-maximum (FWHM) peaks. However, under high substrate temperatures, within-wafer (WIW) stress uniformity is worse. In contrast, lower substrate temperatures correlate to better stress uniformity, but wider FWHM peaks are created (e.g., wider variation in crystalline structure). The crystalline structures of the thin film layers disclosed herein were studied using X-ray diffraction (XRD) techniques, however, other techniques may be used.

Advantageously, a differential temperature control method during the formation of different parts of a deposited thin film layer can be utilized, which introduces a cooling process during part of the deposition process that enables the formation of narrower FWHM XRD peaks in the deposited film, and improved stress uniformity. In some configurations of the differential temperature control method, for example, the substrate is degassed at a high temperature in one chamber, and subsequently a seed layer is deposited on the substrate using a physical vapor deposition (PVD) process while the substrate remains at a temperature that is equal to or close to the high temperature achieved within the substrate during a prior processing step, such as a degas processing step. The substrate can then be transferred to another chamber where the substrate is cooled prior to depositing a bulk layer over the seed layer using a PVD process, at a temperature near room temperature (RT). Herein, room temperature (RT) is less than 100° C., such as from about 20° C. to about 50° C. The differential temperature control process has been found to improve the film properties of the film stack (e.g., seed layer and bulk layer) by reducing film stress, promoting a desired crystal orientation and reducing the variation in crystal orientation of the deposited film layer across the substrate surface. An example of a film stack (i.e., film stack 400) is shown in FIG. 4.

During the process of depositing one or more layers using a sputtering process (i.e., PVD process), differences in the arrangement of the atoms in the thin film layers on the substrate due to thermal properties or surface non-uniformity can result in cone defects, stacking defects, and other surface defects being formed in the deposited film layer. The defects increase surface roughness, and weaken piezoelectric coupling. An improvement in deposited thin film properties can be achieved in various types of deposited film, such as piezoelectric materials, through the methods disclosed herein. During the process of depositing a seed layer by PVD, process parameters such as degas temperature, pressure, bias power, magnetic rotation speed, a distance between target and substrate, and gas composition ratio concentration (e.g., reactive gas ($N_2$) to carrier gas (e.g., Ar, Kr, etc.) ratio) are adjusted in order to improve the stress, stress uniformity, crystal orientation, crystal orientation uniformity and/or thickness uniformity of the deposited thin film layer(s). By adjusting any one of or a combination of process parameters disclosed herein the number of cone- and surface-defects can also be improved in the deposited thin film layer.

The methods and apparatuses disclosed herein enable fine-tuning thin film properties by adjusting various process parameters during one or more steps during the formation of the deposited film stack. Process parameters, deposition time, and a cooling recipe can be adjusted by use of a system controller during processing in order to improve stress uniformity and crystal orientation. The degas temperature, process pressure, substrate bias power, gas concentration ratio are examples of some of the adjustable process parameters. The process parameters can be adjusted alone or in combination with the deposition process time or substrate cooling recipe during or after the seed layer deposition. Accordingly, by fine tuning the above-noted parameters while depositing one or more portion of the film layer stack, an improved stress, within wafer (WIW) stress uniformity, crystal orientation, within wafer (WIW) crystal orientation uniformity and/or thickness uniformity of the deposited thin film can be achieved.

FIG. 1 is a plan view of a cluster tool 100 that is adapted to deposit thin film layers on a substrate. One example of the cluster tool 100 is commercially available from Applied Materials, Inc. of Santa Clara, Calif., and is known as the Endura® system.

The cluster tool 100 includes a factory interface 104, loading dock 140, a first robot 132, and a second robot 136. An orient chamber 152, degas chamber 156, first processing chambers 160 and 168, second processing chambers 164-167, a second robot 136, and a main frame 172 are included in the cluster tool 100. The cluster tool 100 also includes a first transfer chamber 124 and a second transfer chamber 128.

Each cassette 112, or FOUP, is configured to receive a plurality of substrates 201. In this configuration, the substrates 201 are removed from the cassette 112, by one of the factory interface robots 120. The factory interface robots 120 will transfer the substrate 201 from the cassette 112 and load the substrate 201 into the loading dock 140 (i.e., load lock). Upon completion of substrate processing in the cluster tool 100, the processed substrates 201 are then returned to their respective cassette 112.

A main frame 172 includes the first transfer chamber 124 that includes a first robot 132. The first robot 132 is configured to move the substrate 201 between the orient chamber 152, degas chamber 156, and a first processing chamber 160. Each of the orient chamber 152, degas chamber 156, and a first processing chamber 160 is arranged around the periphery of the first transfer chamber 124. In some configurations, the first transfer chamber 124 is vacuum pumped to a moderately low pressure, for example, about 1 milliTorr or less. The second transfer chamber 128 is pumped to a lower pressure, for example, 1 microTorr or less. Accordingly, the first transfer chamber 124 or the second transfer chamber 128 is maintained at least at a moderate vacuum level to prevent the transfer of contamination between the first transfer chamber 124 and the second transfer chamber 128. It is understood that any discussion or description of the first processing chamber 160 necessarily includes the first processing chamber 168, unless explicitly stated otherwise.

A second robot 136 is configured to move the substrate(s) 201 between the first processing chamber 160 and a second processing chamber 164. The second robot 136 is disposed within the second transfer chamber 128. The second robot 136 is configured to transfer substrates 201 to and from the first processing chamber 160 and the second processing chamber 164 or other process chambers 165-168 attached to the second transfer chamber 128 portion of the main frame 172. In one configuration, each of the first robot 132 and the second robot 136 is a "frog-leg" type robot, available from Applied Materials, Inc. of Santa Clara, Calif. The first transfer chamber 124 can be selectively isolated from each of the orient chamber 152, degas chamber 156, and first processing chamber 160 by use of slit valves (not shown) that are disposed between each of the orient chamber 152, degas chamber 156, and first processing chamber 160. The second transfer chamber 128 can be selectively isolated from each of the first processing chamber 160 and the second processing chamber 164 by use of slit valves that are disposed between each of the first processing chamber 160 or the second processing chamber 164. Herein, it is understood that any discussion or description of the second processing chamber 164 includes any one of the second processing chambers 165-167.

Each loading dock 140 is each selectively isolated from both the first transfer chamber 124 by slit valves and from the exterior region 116 of the factory interface 104 by vacuum doors (not shown). In this configuration, the factory interface robots 120 in the factory interface are configured to move a substrate 201 from a cassette 112 to the loading dock 140. The substrate 201 is then isolated from the exterior region 116 of the factory interface 104 by the vacuum door (not shown) coupled to the loading dock 140. The substrate 201 is transferred to the loading dock 140. After the loading dock 140 is pumped down to a desired pressure, the substrate 201 can then be accessed by the first robot 132 through a slit valve opening (not shown) formed between the first transfer chamber 124 and the loading dock 140.

Each substrate 201 is loaded into a cassette 112 that is coupled to a factory interface 104. The substrate 201 may have a diameter in a range from about 100 mm to about 750 mm. The substrate 201 may be formed from a variety of materials, including Si, SiC or SiC-coated graphite. In one example, the substrate 201 includes a silicon carbide material and has a surface area of about 1,000 cm$^2$ or more. In another example, the surface area of the substrate 201 may be about 2,000 cm$^2$ or more, and about 4,000 cm$^2$ or more.

One or more orient chambers 152 may be used to align the substrate 201 in a desired rotational orientation within the cluster tool 100. By aligning the substrate 201, the substrate 201 is also aligned. The orient chamber 152 may be positioned proximate the loading dock 140 and proximate the degas chamber 156.

In some embodiments, the orient chambers 152 include a heat source, such as lamps or infrared generating radiant heaters. The heat source within the orient chambers 152 can be adapted to heat the substrate 201 and each substrate 201 to a desired temperature. The orient chambers 152 can be pressurized under a vacuum condition to ensure that any undesirable water or other contamination is removed from the surface of the substrate 201 prior to processing in other downstream chambers.

In some embodiments, the cluster tool 100 includes a pre-clean chamber 156 that is adapted to clean the surface of a substrate 201 by use of cleaning process that includes exposing the surface of the substrate to a radio frequency (RF) generated plasma and/or one or more pre-cleaning gas compositions that includes a carrier gas (e.g., Ar, He, Kr) and/or a reactive gas (e.g., hydrogen). In some embodiments, the pre-clean chamber 156 is adapted to perform a process that may include a non-selective sputter etching process. The pre-clean chamber 156 will typically include components similar to the components found in the processing chamber 300, which is described below in conjunction with FIG. 3.

Each first processing chamber 160 is configured to process the substrate(s) 201 therein. Processing may include cooling the substrate, heating the substrate 201, etching and/or depositing one or more layers on a surface of the substrate 201. In one configuration, the first processing chamber 160 is configured to cool or heat a substrate 201.

Each of the processing chambers 164-167 are adapted to perform an etch and/or deposition process. In some embodiments, the deposition process may include a sputter deposition process (i.e., PVD deposition process). The sputter deposition process may also include temperature regulation step that is adapted to a cool down and/or control the temperature of the substrate during processing.

Figure 2:
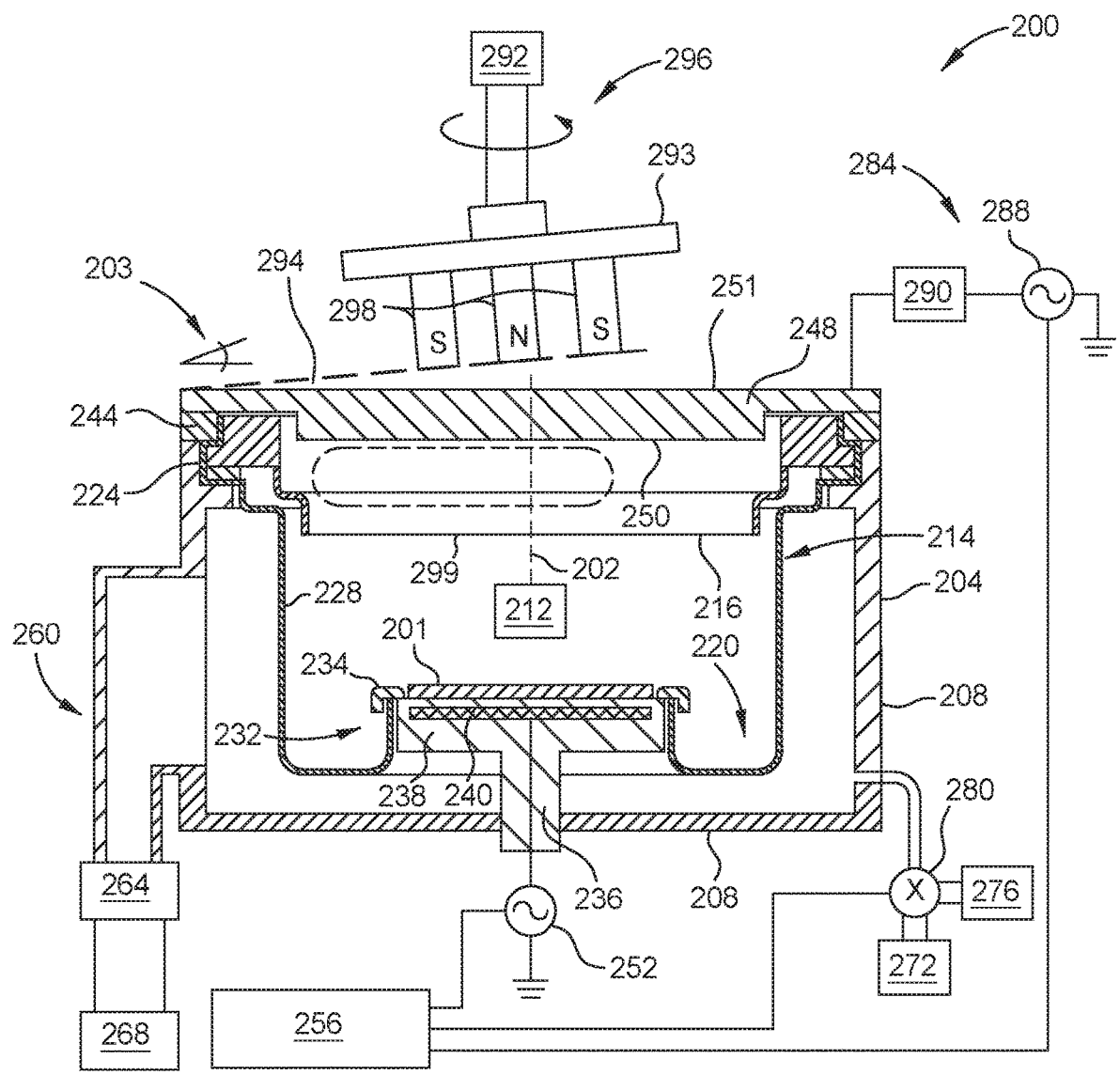
FIG. 2 is a side cross-sectional view of one of the processing chambers that is adapted to deposit thin film layers on the substrate in the cluster tool illustrated in FIG. 1, according to an embodiment described herein.

FIG. 2 is a plan view of a process chamber 200 that can be part of one or more of the processing chamber 164-167. The process chamber 200 is adapted to deposit thin film layers on the substrate 201 in the cluster tool illustrated in FIG. 1. The processing chamber 200 can be a magnetron type PVD chamber available from Applied Materials, Inc. of Santa Clara, Calif. The processing chamber 200 includes a chamber 204, a target 248, a magnetron 296, a vacuum pumping system 260, a substrate support assembly 232, and a process kit 214. In one example, the target 248 is a Scandium (Sc) doped aluminum (Al) target. In another example, the target 248 may be made from Al.

The chamber 204 supports the target 248, which is sealed at one end of the chamber 204 through a target isolator 244 using a plurality of O-rings. The chamber 204 may be held under vacuum.

The process kit 214 includes an edge ring 234, a first shield 216 and the second shield 220 that are separated by a second dielectric shield isolator 224. The process kit 214 parts are positioned within the chamber 204 to protect the chamber wall 208. A metal within the process kit 214 is electrically grounded from the sputtered material that is generated in an interior volume 212. The first shield 216 may be permitted to float electrically and the second shield 220 is electrically grounded. In an alternate example, either or both of the first shield 216 or second shield 220 may be grounded, floating or biased to the same or different non-ground levels. The first shield 216 and second shield 220 may be made of stainless steel. An inner surface 228 may be bead-blasted or otherwise roughened to promote adhesion of the material sputter deposited on the inner surface 228.

The substrate support assembly 232 includes a pedestal 236. The pedestal 236 may include an electrostatic chuck 238 that has a supporting surface that is adapted to support a substrate 201 over an electrode 240. It is appreciated that other devices may be used to hold the substrate 201 in place during processing. Resistive heaters, refrigerant channels, and/or thermal transfer gas cavities, which are not illustrated in FIG. 2, may be formed in the pedestal 236 to provide thermal control of the substrate 201 during processing. The electrode 240, which is coupled to a first power supply 252, may apply an RF and/or a DC bias to the substrate 201 to attract a plasma 299 ionized deposition material and processes gases. In other applications, biasing of the substrate 201 may be reduced or eliminated to further reduce the potential for damage to the deposited thin film layer.

The target 248 has at least a surface portion made of a material to be sputter deposited on substrate 201. In one example, a pulsed DC, RF and/or a pulsed RF bias signal is applied to the target 248 by a second power source 284. The pulsed DC, RF and/or pulsed RF bias signal enables the deposition of an optional non-conductive layer, such as a PZT or aluminum nitride layer. In order to attract the ions generated by the plasma 299 to sputter the target 248, the target 248 may be biased by the second power source 284 to provide an average power of 1 to 20 KW, for example. The pulsed DC and/or RF bias signal applied to the target 248 may include a signal that has a plurality of alternating first and second intervals (detailed below). During each of the first intervals, the voltage of the applied bias signal is negative to attract ions to sputter the target 248. During the alternating second interval, the applied bias signal is lower than the bias applied during the first interval, unbiased (e.g., zero applied voltage). In some examples, the applied bias signal has a positive voltage to repel positively charged ions from the target 248 to reduce arcing.

One skilled in the art will appreciate that the pulsed bias signal applied to the target 248 can provide many beneficial processing advantages, depending upon the particular application. For example, the pulsed bias signal may be used to reduce the deposition rate, form plasma 299, and increase the peak energy in the plasma 299 for effectively controlling a plasma chemistry to form a film stack 400 (illustrated in FIG. 4). For example, thin film layers which are closer to stoichiometric proportions might be obtained when a pulsed biasing signal is applied to the target 248. Still other possible features include an increase in thin film quality, particularly for the film stack 400. Additionally, thin film sheet resistance may be reduced, due to possible elimination of undesirable micro voids and columnar structures, when a pulsed bias is applied. It is appreciated that in some examples, a non-pulsed biasing signal may be applied to bias the target 248 during one or more parts of the deposition process, or in combination with a pulsed bias signal. The non-pulsed biasing signal can be a constant DC or an RF power level bias signal.

The substrate 201 mounted on the pedestal 236 can be biased to attract or repel ions generated in the formed plasma 299. For example, the first power supply 252 may be provided to apply RF power to the pedestal 236 to bias the substrate 201 to attract deposition material ions during the deposition process. In addition, the first power supply 252 may be configured to apply RF power to the electrode 240 of pedestal 236 to couple supplemental energy to the plasma 299. During the deposition process, the pedestal 236 may be electrically floating. Accordingly, a negative DC bias may nonetheless develop on the pedestal 236. Alternatively, the pedestal 236 may be biased by a source at a voltage of between −1000 Volts to +500 Volts, such as about −30 VDC. For example, the pedestal 236 may be biased in order to bias the substrate 201, attracting the ionized deposition material to the substrate 201. In some configurations, a capacitor tuner (not shown) can be used with the second power source 284 to control the floating potential on the substrate 201 during processing. In an alternative example, the substrate 201 may be left floating electrically.

If the first power supply 252, used to bias the substrate 201 through the pedestal 236, is an RF power supply, the supply may operate at a frequency of about 13.56 MHz to about 60 MHz. The pedestal 236 may be supplied with RF power in a range of 10 watts to 5 kW. A computer-based controller 256 may be programmed to control the power levels, voltages, currents and frequencies. Accordingly, it is understood that the above-mentioned power level, voltage level, and frequencies may vary according to the program.

The vacuum pumping system 260 includes a pump assembly 268 and valve 264. The pump assembly 268 may include a cryopump, roughing pump(s) (not shown) that are used to maintain a desirable pressure in the interior volume 212 of the processing chamber 200.

The magnetron 296 is disposed adjacent to and is rotated relative to the target 248. A plurality of magnets 298 is included in the magnetron 296. The plurality of magnets 298 includes plural polarized magnets N, and plural magnets S having an opposite polarization to magnets N. The magnets 298 are used to confine plasma 299 generated in the interior volume 212 by biasing the target 248 using the second power source 284 to sputter material from a front surface 250 of the target 248. The second power source 284 has a second power supply 288 that is configured to deliver DC and/or RF power to the target 248. In some example, delivery of RF power to the second power source 284 may also include a match circuit 290.

The magnetron 296 can be tilted with respect to a surface of the target 248, such as the front surface 250 or back surface 251. In other words, the magnetron 296 forms an angle 203 with respect to a central axis 202 or the axis of rotation of the magnetron 296. The tilting of the magnetron 296 at an angle 203 may be controlled by the controller 256 via the motor 292. The degree of the tilting of the magnetron 296 may be adjusted between processing batches, between substrates 201, or in-situ during the processing of the substrate(s) 201. The angle 203 at which the magnetron 296 is tilted may be controlled based on thin film thickness or stress data feedback. The specific component of the magnetron 296 that is tilted at the angle 203 with respect to the target 248 may vary. In one example, the longitudinal dimension of the backing plate 293 (e.g., yoke) is tilted at the angle 203 with respect to the target 248. In one example, a plane 294 (e.g., parallel to the X-Y plane) defined by lower ends of magnets 298 facing the back surface 251 of the target 248 is tilted at the angle 203 with respect to the target 248. In one example, the magnetron 296 is tilted with respect to the back surface 251 of the target 248. In another example, the magnetron is tilted with respect to the front surface 250.

In one embodiment, when the magnetron 296 is rotated about the central axis 202 by a rotation motor 292 during processing, the angle 203 is maintained between the magnetron 296 and the target 248, such that any point on the magnetron 296, as is rotated about the central axis 202, will remain the same vertical distance (i.e., Z-direction distance) from a surface of the target 248, such as the back surface 251. As the magnetron 296 rotates, the strength of the magnetic field produced by the magnetron 296 is an average of the various strengths of magnetic fields produced by each magnet 298. The magnetic field is averaged across the front surface 250 of the target 248. The averaging of the strengths of the magnetic fields enables uniform thin film properties and uniform erosion of the target 248.

The angle 203 is determined by establishing an angle between the back surface 251, as shown in FIG. 2, of the target 248 and the plane 294 of the magnetron 296. Another manner of determining the angle 203 is establishing an angle between the front surface 250 of the target 248 and the plane 294 of the magnetron 296. For simplicity, any discussion of the angle 203 formed between the magnetron 296 and the target 248, necessarily include the surfaces 250 or 251 of the target 248 and the plane 294 of the magnetron 296. The angle 203 formed between the magnetron 296 and the target 248 may be from about 0.2 degrees to about 5 degrees. In another example, the angle 203 is from about 1 degree to about 2 degrees. If the angle 203 of the tilting of the magnetron 296 with respect to the target 248 is less than about 0.2 degrees, the effect of the averaging of the magnetic fields strengths can be diminished. As noted, the angle 203 of the tilted magnetron 296 with respect to the target 248 is less than or equal to about 5 degrees. Accordingly, the magnetron 296 and the central axis 202 form an acute angle (not labelled) ranging from about 85 degrees to about 89.7 degrees. The acute angle may range from about 88 degrees to about 89 degrees. A sum of the angle 203 and the acute angle is typically 90 degrees.

A first gas source 272 supplies a gas to the chamber 204 through a mass flow controller 280. One example of the gas is a chemically inactive noble gas, such as argon (Ar). The gas can be admitted to the top of the chamber 204, or as illustrated, at the bottom of the chamber 204. One or more inlet pipes (not illustrated) penetrate apertures through the bottom of a second shield 220. Alternatively, inlet pipes may be coupled to apertures within the pedestal 236. During PVD processes, a nitrogen (N) gas may be delivered from a second gas source 276 to form a layer on the substrate 201. The layer may include a material such as aluminum nitride (AlN).

Figure 3:
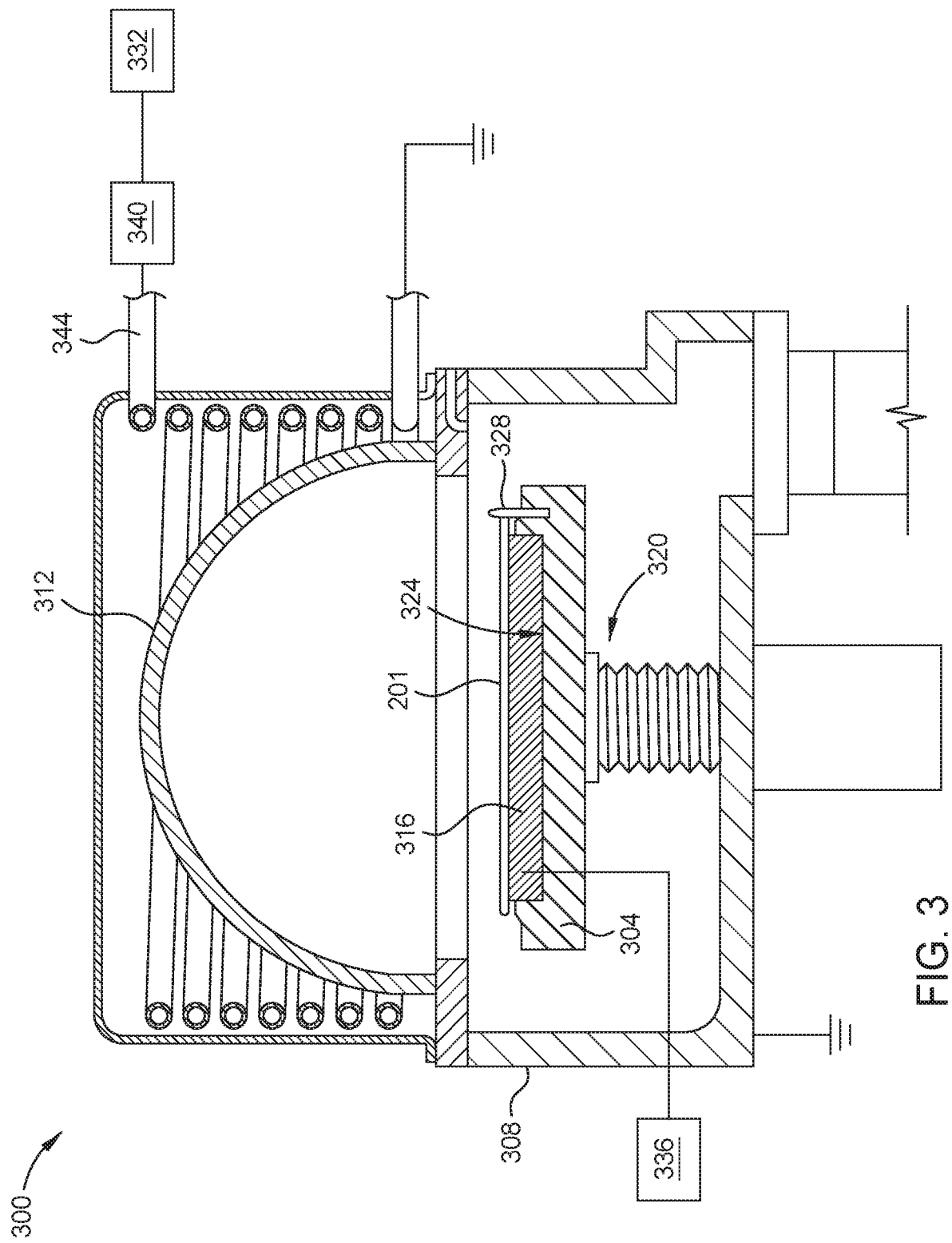
FIG. 3 is a side cross sectional view of another processing chamber adapted to process the substrate in the cluster tool illustrated in FIG. 1, according to an embodiment described herein.

FIG. 3 is a cross sectional view of another processing chamber 300 adapted to process the substrate in the cluster tool illustrated in FIG. 1. An example of the processing chamber 300 useful for the present disclosure is the Pre-Clean II Chamber available from Applied Materials, Inc., Santa Clara, Calif.

The pre-clean chamber 300 has a substrate support assembly 304 disposed in a chamber enclosure 308 under a dome 312. In one example, the dome 312 may be made from quartz. The pedestal 320 includes the substrate support assembly 304 having a substrate support 316. The substrate support 316 is disposed within a recess 324 on the substrate support assembly 304. During processing, the substrate 201 is placed on the substrate support 316. At least one locating pin 328 retains the substrate in a desired lateral position on the substrate support 316.

A coil 344 is disposed outside of the dome 312 and connected to an RF power source 332. The RF power source 332 initiates and maintains a plasma formed from the process gases within the processing chamber 300. An RF match network 340 is provided to match the RF power source 332 and the coil 344. The substrate support assembly 304 is connected to a DC power source 336 that provides a bias to the substrate support assembly 304.

Figure 4A:
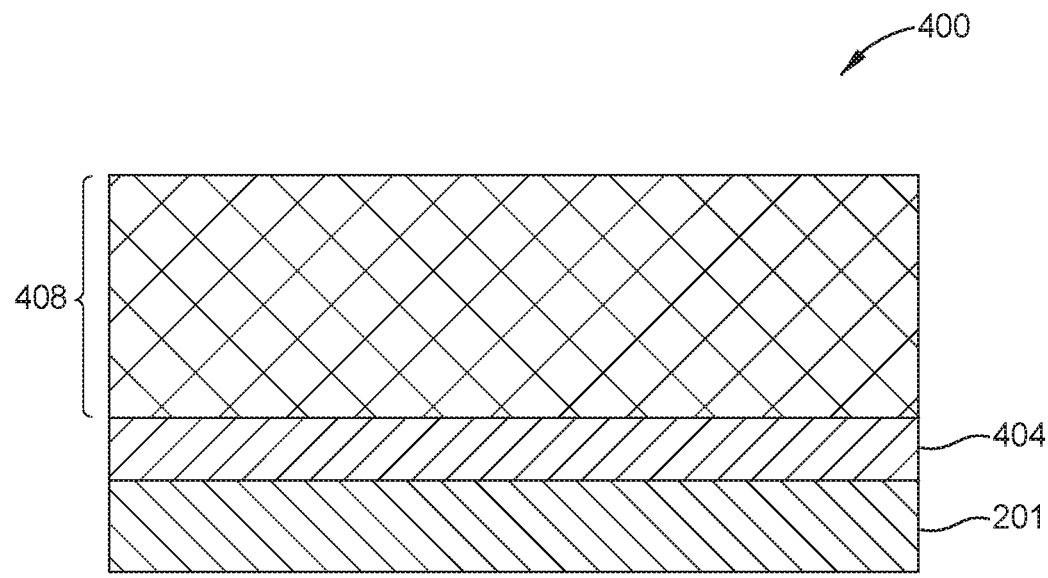
FIG. 4A is a side view of an exemplary film stack produced within the cluster tool disclosed in FIG. 1, according to an embodiment described herein.
Figure 4B:
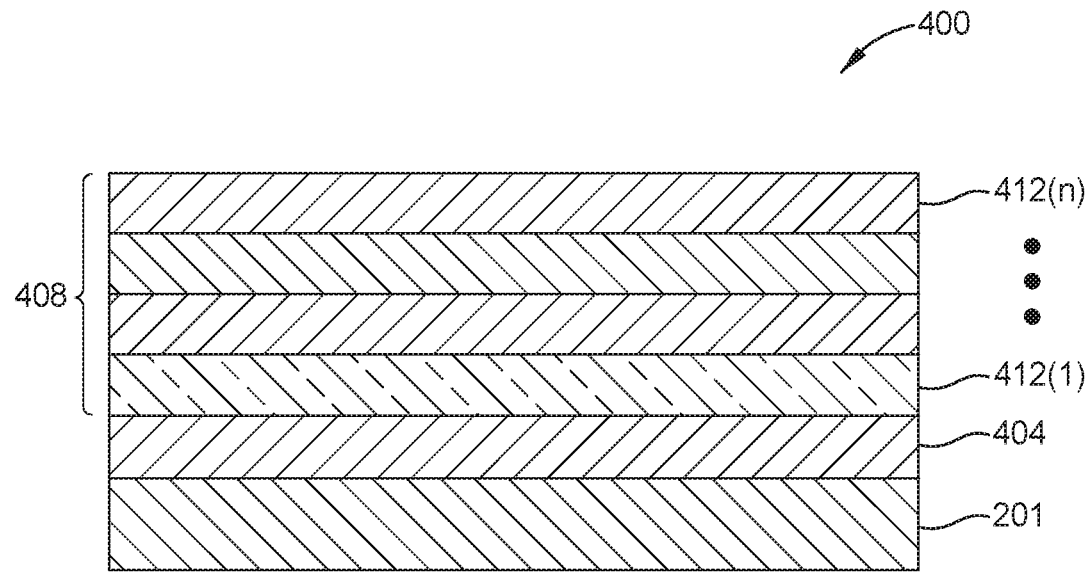
FIG. 4B is a side view of an exemplary film stack produced within the cluster tool disclosed in FIG. 1, according to an embodiment described herein.

The substrate 201 may be pre-cleaned or etched using the plasma in the processing chamber 300 prior to depositing one or more layer within a film stack 400, such as seed layer 404 (shown in FIGS. 4A and 4B). Once the substrate 201 is positioned for processing in the processing chamber 300, a processing gas is introduced into the interior volume 212. The processing gas may include between about 0% and about 100% hydrogen (H) and the balance a carrier gas. The processing gas may be between about 5% and about 50% of H.

The processing gas can include a carrier gas, such as Ar or helium (He), at a concentration of between about 95% and about 50%. The processing gas is ignited in the interior volume 212 to form the plasma, thus subjecting the substrate 201 to the plasma. For example, plasma may be generated by applying between about 50 W and about 500 W of power from the RF power source 332 to the coil 344. The DC power source 336 may also provide power between about 10 W and about 300 W of DC bias power. The plasma may be maintained for a period between about 10 seconds and about 300 seconds. Once the pre-cleaning process is completed, processing chamber 300 is evacuated to exhaust the processing gas and the reacted byproducts from the processing chamber 300.

FIG. 4A is a side view of an exemplary film stack 400 produced within the cluster tool disclosed in FIG. 1. The film stack 400 includes the substrate 201 and the seed layer 404, and may also include the bulk layer 408. A seed layer 404 is formed on a surface of the substrate 201. A bulk layer 408 is formed on top of and in contact with a surface of the seed layer 404. In at least one example, a material of the seed layer 404, the bulk layer 408 are the same material, and the physical properties of the seed layer 404 and bulk layer 408 are different. In another example, the seed layer 404 and the bulk layer 408 may be formed from a different material. Alternatively, as shown in FIG. 4B, the bulk layer 408 can be formed from several interlayers 412.

FIG. 4B is a side view of the exemplary film stack 400 shown in FIG. 4A illustrating an alternative formation of the bulk layer 408. The film stack 400 may include the substrate 201, the seed layer 404, and the bulk layer 408. A seed layer 404 is formed on a surface of the substrate 201. A bulk layer 408 is formed on top of and in contact with a surface of the seed layer 404. The bulk layer 408 may include one or more interlayers 412, where the interlayers 412 may be expressed as 412($n$), where n is the number of interlayers 412 in the bulk layer 408 that may vary from 1 to n. For example, while n=4 in the example illustrated in FIG. 4, in an alternate example, n is from 1 to 30. As stated above, in at least one example, a material of the seed layer 404, and one or more of the interlayers 412 of the bulk layer 408 are formed of the same material. In this example, at least some of the physical properties of the seed layer 404, and the one or more interlayers 412 are different.

In one example, the seed layer 404 and bulk layer 408 are made from a piezoelectric material such as scandium-doped aluminum nitride (ScAlN) or aluminum nitride (AlN). In another example, the piezoelectric material can be any one of or a combination of titanium nitride (TiN), hafnium nitride (HfN), or silicon nitride ($SixN_y$). The substrate 201, in some examples, has a crystal orientation of <001>. The substrate 201 may be made from other metals having an appropriate lattice, including but not limited to a polycrystalline molybdenum, and AlN.

Figure 5A:
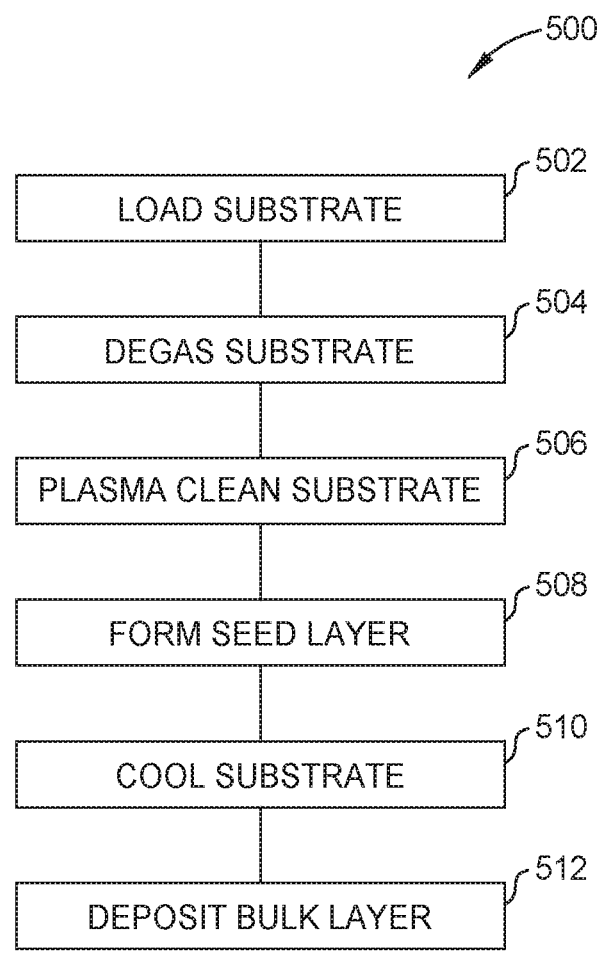
FIG. 5A is a flow chart depicting an exemplary method of producing the film stack within the cluster tool illustrated in FIG. 1, according to an embodiment described herein.

FIG. 5A is a flow chart depicting an exemplary method 500 of producing the film stack 400 within the cluster tool illustrated in FIG. 1.

At block 502, the substrate 201 is loaded into the loading dock 140 of the cluster tool 100. In an example, the first robot 132 moves the substrate 201 to the orient chamber 152. The substrate 201 is passed through the first transfer chamber 124 by the first robot 132. The robot 132 in the first transfer chamber 124 moves the substrate 201 from the orient chamber 152 to the first processing chamber 160. As stated above, pressure (P) in the first transfer chamber 124 may be about 1 microTorr. Accordingly, the pressure is held in a vacuum state.

At block 504, the substrate 201 is disposed within a degas chamber 156 or a degas process is performed in the orient chamber 152. In one embodiment, the substrate 201 is transferred from the loading dock 140 into the degas chamber 156. The substrate 201 is moved through the first transfer chamber 124 as the substrate 201 moves from the loading dock 140 to the degas chamber 156. Alternatively, the first robot 132 transfers the substrate 201 from the loading dock 140 to the orient chamber 152. The first robot 132 transfers the substrate 201 from the orient chamber 152 to the first processing chamber 160. The temperature (T) of the substrate 201 can be any temperature between about 120 degrees Celsius and about 600 degrees Celsius, such as about 200° C. to about 600° C. In another example, temperature of the substrate 201 can be any temperature between about 140° C. and about 500° C.

Figure 5B:
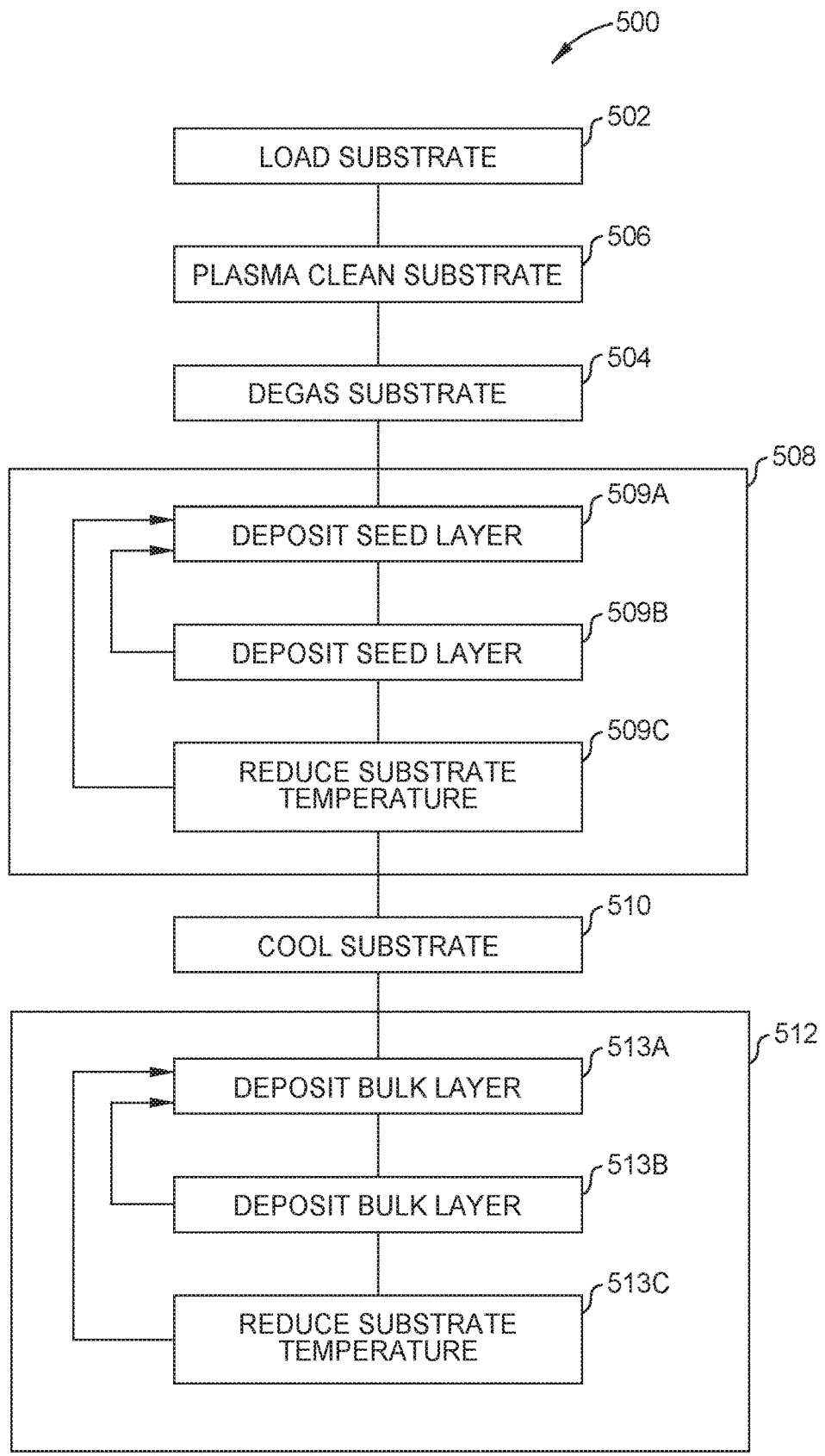
FIG. 5B is a flow chart depicting an exemplary method of producing the film stack 400, according to an embodiment described herein.

Optionally, a surface of the substrate 201 is exposed to a plasma at block 506 to preclean the surface of the substrate. In some embodiments, the processes performed in block 506 are performed after performing the processes in block 504. Alternatively, in some embodiments of the method 500, the processes performed in block 506 are performed before performing the processes in block 504, as illustrated in FIG. 5B. While FIG. 5B includes the positions of blocks 504 and 506 in method 500 being in a different order than the order shown in FIG. 5A, this configuration is not intended to limit the method illustrated in FIG. 5B to that specific order of processes. During block 506 the surface of the substrate can be pre-cleaned (e.g., bombarded with reactive gas (e.g., $H_2$) or non-reactive gas (e.g., Ar, Ne, He) ions and/or gas radicals (e.g., etched)) in the processing chamber 300. The processes performed during block 506 can also include heating, maintaining the incoming temperature of the substrate or cooling the substrate 201. Pre-cleaning the surface of the substrate 201 prior to depositing the seed layer 404, can reduce surface defects in the seed layer 404 when the seed layer 404 is deposited on the substrate 201.

The seed layer 404 is formed on the substrate 201 at block 508 using the second processing chamber 164. The second processing chamber 164 receives the substrate 201 from the first processing chamber 160. The substrate 201 passes through the second transfer chamber 128 as the substrate 201 is moved from the first processing chamber 160 to the second processing chamber 164. The seed layer 404 can be formed in the second processing chamber 164 that includes the components shown in processing chamber 200. The process performed during block may include delivering a pulsed DC, RF and/or a pulsed RF bias signal to the target 248 by the second power source 284. In order to attract the ions generated by the plasma 299 to sputter the target 248, the target 248 may be biased by the second power source 284 to provide an average power of 1 to 20 KW, for example. The substrate 201, during block 508, can be mounted on or positioned over the pedestal 236 so that the temperature of the substrate can remain at, or can be substantially maintained at, the incoming temperature of wafer (e.g., degas process temperature or pre-clean process temperature, etc.). In one example, the incoming substrate temperature, and thus substrate processing temperature, is greater than room temperature, such as between about 120° C. and about 600° C. The substrate 201 can additionally be mounted on the pedestal 236 that can be biased. For example, the first power supply 252 may be provided to apply RF power to the electrode 240 in the pedestal 236 to bias the substrate 201 to attract deposition material ions during the deposition process, such as biasing the substrate at a voltage of between −1000 Volts to +500 Volts, such as about −30 VDC. The seed layer 404 may have a thickness from about 10 nm to about 100 nm. In one example, the seed layer 404 has a thickness from about 10 nm to about 50 nm. It has been found that, by maintaining a high initial temperature (e.g., degas temperature), defects formed in the seed layer 404 decrease. It has been found that, defects in the seed layer 404 further decreases as a bias power, applied to the substrate 201, is increased. Therefore, in some embodiments a high initial temperature (e.g., degas temperature) is maintained on the substrate 201 while a bias power is applied to the substrate 201. In one example, the incoming substrate 201 temperature, and thus substrate processing temperature, is between about 120° C. and 600° C. and a substrate bias of about −30 VDC is applied to the substrate 201 by biasing the electrode 240 in the substrate support (i.e., pedestal 236) during processing. The second robot 136 moves the substrate 201 from the second processing chamber 164 to the first processing chamber 160.

Figure 6:
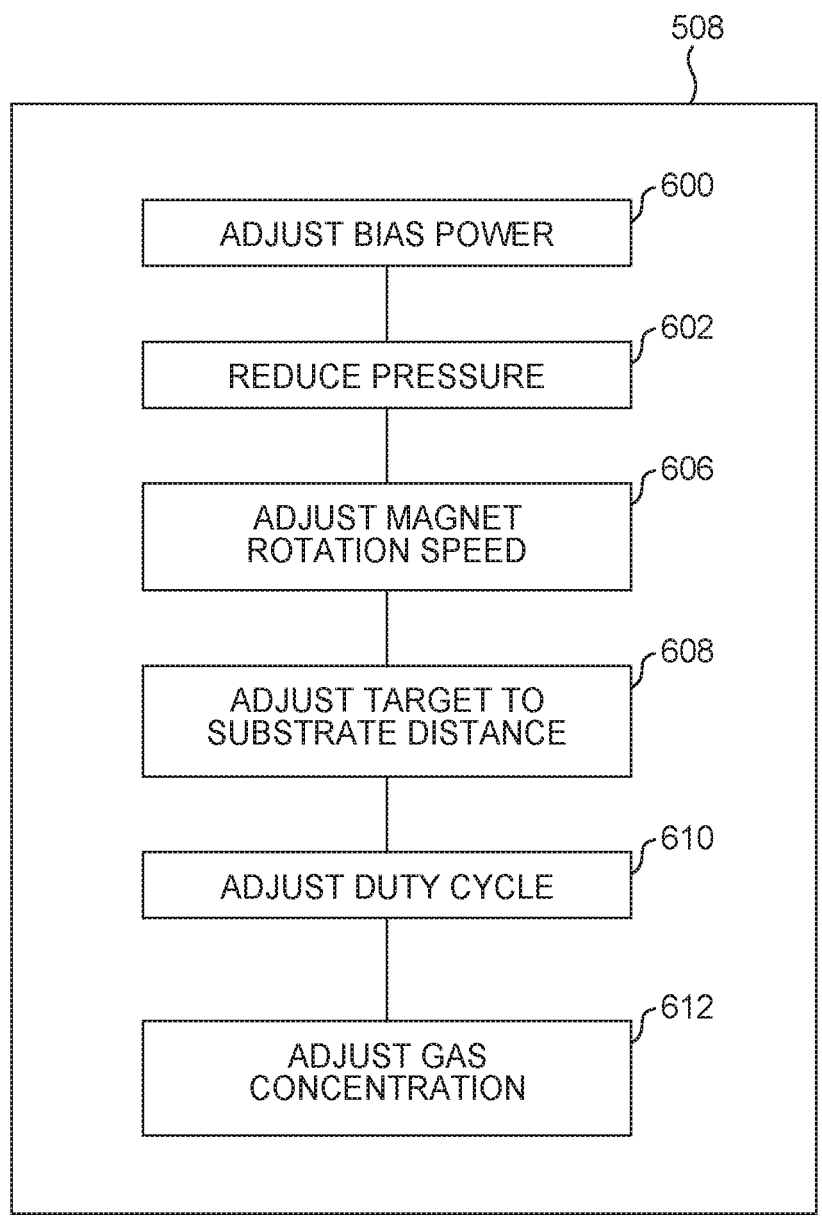
FIG. 6 is a flow chart illustrating a method of forming a seed layer or portion of a bulk layer, according to an embodiment described herein.

FIG. 6 is a flow chart of a process of forming a seed layer 404 by use of a seed layer formation block 508, which is illustrated in FIG. 5A or 5B. It is understood that any one of or, all of blocks 600-612 may be carried out during performance of the seed layer 404 formation process performed during block 508.

At block 600, a bias power applied to the electrode 240 can be adjusted during the deposition process completed during block 508. In this example, a bias power may be either one of a first bias power P1 or a second bias power P2. The bias power may be between about 10 Watts to about 200 Watts. As the bias power increases, the defects formed within the seed layer 404 have been found to decrease. Thus, in some embodiments, a bias power greater than about 50 W, or greater than 100 W, or even greater than 120 W is applied to the electrode 240 during the deposition process completed during block 508.

At block 602, a pressure at which the substrate 201 is subjected to during the formation of the seed layer 404 at block 508 can be reduced. The pressure may be reduced to about 15 mTorr or less. By reducing the pressure at which the seed layer 404 is formed, a reduction in defects in the seed layer 404 can be achieved.

A magnetic rotation speed of the magnetron 296 is increased at block 606. The magnetic rotation speed may be between about 30 rotations per minute (rpm) and about 120 rpm. In one example, the magnetic rotation speed may be between 50 rpm include speeds up to about and about 90 rpm. In some configurations, the magnetic rotation speed can vary between 90 rpm and about 120 rpm. Surface defects on the seed layer 404 may be reduced by increasing the rotation speed of the magnetron 296 during the formation of the seed layer 404 during block 508 versus the rotation speed that is used to form the bulk layer 408 during block 512. The magnetic rotation speed of the magnetron 296 can be also be adjusted with during the formation of the seed layer 404.

At block 608, a distance from the target 248 to the surface of the substrate 201 is adjusted during the formation of the seed layer 404 during block 508. Otherwise stated, the distance between the surface of target 248 and the surface of the substrate 201 is established. The distance between the target 248 and substrate 201 can be from about 30 mm to about 70 mm. As the distance increases from 30 mm to about 70 mm, uniformity of the seed layer 404 increases. Accordingly, surface defects on the seed layer 404 are reduced.

At block 610, a duty cycle of the signal produced by the second power source 284 can be adjusted during the formation of the seed layer 404 during block 508. As articulated above, the signal may be a DC, RF and/or pulsed RF bias signal. The seed layer 404 may be deposited at a seed duty cycle $D_{seed}$. The seed duty cycle $D_{seed}$ may be from 60% to 90%. Accordingly, the second power source 284 can be turned "on" from about 60% to 90% of the duty cycle. Correspondingly, the second power source 284 may be "off" for a period of 10% to 40% of the duty cycle. In one example, the power "on" time is 88.5% and "off" time is 12.5% of the duty cycle. In another example, the power "on" time is 67% and "off" time is 33%. By reducing the time in which the signal is "off," seed layer 404 surface defects are reduced. In some examples, the bulk layer 408 can be deposited at a different duty cycle.

At block 612, a concentration of nitrogen (N) in the processing gas provided to the chamber 204 is adjusted during the formation of the seed layer 404 during block 508. In this example, the concentration of N is between 100% of the processing gas and 66% of the processing gas. As the concentration of N in the processing gas increases, the surface defects on the seed layer 404 are reduced. In some examples, the nitrogen contribution is $N_2$. As stated above, each of the blocks 600-612 can be adjusted individually or in combination with the other blocks during the formation of the seed layer 404, and/or during the seed layer formation block 508.

Referring back to FIG. 5A, at block 510, the substrate 201 is cooled in the first processing chamber 160 to a temperature less than 100° C., such as a temperature between about room temperature (e.g., ~20° C.) and 50° C. During block 510, the substrate 201 can be cooled in an environment that includes Ar and $N_2$. A ratio of Ar to $N_2$ may be about 5 to 1. In an exemplary configuration, the ratio of Ar to N may be about 3 to 1. The pressure (P) may be from about 3 Torr to about 15 Torr, during the process performed during block 510 to rapidly cool the substrate 201. The substrate 201 is cooled until the substrate 201 reaches a designated temperature (T). In some embodiments, the substrate 201 is cooled in the same chamber where the seed layer 404 is deposited. Alternatively, the substrate 201 can be cooled in a different chamber than where the seed layer 404 is deposited. In one non-limiting example, it may take from about 1 second to about 100 seconds in order for the substrate 201 to reach the designated temperature. In one configuration, the substrate 201 may reach the designated temperature in about 20 second to about 50 seconds. The pressure (P) at which the substrate 201 is cooled at block 510 is higher than the pressure at which the substrate 201 is processed at block 502 to block 508. In some configurations, as noted above, it is desirable to perform the processes performed in block 510 in a separate process chamber from the chamber the seed layer is formed in due to the time that would be required to remove the amount of gas needed to achieve the processing pressure achieved during block 510 from the processing chamber the seed layer is formed in before forming another seed layer on another substrate. The temperature may be reduced at a rate from about 600° C. to about 200° C. in about 1 second to about 100 seconds, such as about between 1 second and 20 seconds. In an alternate example, the temperature may be reduced at a rate from about 600° C. to about 200° C. in about 20 seconds to about 50 seconds. In an example where the substrate 201 is cooled in the different chamber than where the seed layer 404 is deposited, the temperature of the substrate 201 may be reduced to at a rate between about 50° C. and about 100° C. in about 1 second to about 100 seconds. Alternatively, the substrate 201 may be cooled in from about 20 seconds to about 50 seconds. In yet another example, the temperature may be reduced at a rate from about 600° C. to about 250° C. in 1 second to about 100 seconds, such as about 20 seconds to about 50 seconds.

At block 512, the bulk layer 408 is formed on the substrate 201. The bulk layer 408 can be formed in the second processing chamber 164 that includes the components shown in processing chamber 200. A bulk layer 408 includes at least one interlayer 412 that is formed on the substrate 201 in the second processing chamber 164. In one example, the bulk layer 408 can be formed to have a thickness from about 1 micron to 10 micron. However, the thickness of the bulk layer 408 is not limited to this range and may be deposited on the substrate 201 to any desired thickness. Because the bulk layer 408 is deposited near room temperature (RT), a temperature at which the bulk layer 408 is deposited is lower than the temperature at which the seed layer 404 is deposited. As stated above, room temperature is less than about 100° C.

FIG. 5B is a flow chart depicting a version of the exemplary method 500 of producing the film stack 400 that includes a process for forming the seed layer 404 or the bulk layer 408 by performing a series of sequential processing steps, according to another embodiment of the disclosure. Block 508 and block 512 in FIG. 5B are substantially the same as described with respect to FIG. 5A with the exception that the intermediate steps shown in blocks 509A to 509C of block 508 and the intermediate steps shown in blocks 513A to 513C of block 512 have been added. Additional blocks 509A to 509C performed at block 508, and additional blocks 513A to 513C performed at block 512 are disclosed below and utilize substantially the same process sequence steps that may form film layers that either have similar or differing material properties. In at least one example, where differing material properties of the seed layer 404 and bulk layer 408 is desired, include cases where the seed layer 404 and the bulk layer 408 have different film thicknesses and/or utilize different process settings to achieve different material properties (e.g., film stress, crystal orientation, electrical properties (e.g., resistivity)) during the performance of one or more of the blocks 509A-509C versus the performance of one or more of the blocks 513A-513C. The processes performed during blocks 509A-509C may include the use of one or more of the processes or process settings described in conjunction with FIG. 6 to form at least a portion of the seed layer 404.

In some embodiments, the seed layer 404 is formed at block 508 on the substrate 201, and block 508 may include two or more processing steps, such as blocks 509A to 509C as shown in FIG. 5B. In one embodiment, block 509A includes the formation of a first interlayer 412(1) that is deposited at a temperature that is significantly higher than the temperature that the subsequent interlayers (e.g., interlayers 412(2)-412(n)) of seed layer 404 are formed. In some embodiments, the first interlayer 412(1) of the seed layer 404 is formed at a temperature between about 120° C. and 600° C. In some embodiments, the temperature of a substrate disposed in a processing region of the processing chamber 164 during formation of interlayers 412(1)-412(n) is substantially constant. The seed layer 404 is formed in an environment of Ar and N. The ratio of Ar to N may be about 2 to 1. During block 509A the first power supply 252 applies a first bias power P1 to the substrate 201 using the electrode 240 for a first duration of time (t1). A first interlayer 412(1) is formed on the film stack 400. The first bias power P1 is between about 30 Watts and about 150 Watts.

A second interlayer 412(2) is formed on top of and in contact with the first interlayer 412(1), at block 509B. A second power bias P2 is applied to the substrate 201 through the electrode 240 from the first power supply 252, for a second duration of time (t2). The first duration of time is between about 1 second and about 200 seconds. The second duration of time is greater than 250 seconds and less than or equal to about 2000 seconds. In one example, the first time may be about 470 seconds and the second time can be about 1080 seconds. In some embodiments, the second interlayer 412(2) of the seed layer 404 is formed at a temperature that is lower than or equal to the temperature that first interlayer 412(1) is formed, and can be in a temperature range between about 120° C. and 600° C. A second bias power P2 is less than about 120 Watts and greater than or equal to 20 watts. For example, the first bias power P1 may be about 100 watts and the second bias power P2 may be about 60 watt. In another example, the second bias power P2 can be about 80 Watts.

The first interlayer 412(1) and the second interlayer 412(2) can be formed in the same second processing chamber 164. In an alternative example, the first interlayer 412(1) and the second interlayer 412(2) may be formed in a different processing chamber of the cluster tool 100, such as one of processing chambers 165-167. Accordingly, in at least one example, the first bias power P1 is higher than the second bias power P2. In the same example, the second duration of time (t2) is greater than the first duration of time (t1). An exemplary frequency of either the first bias power P1 or second bias power P2 is about 13.56 MHz.

For simplicity of discussion, the term interlayer 412 is used to describe the formation of the multiple layers of the seed layers 404 and multiple layers of the bulk layer 408. However, while the same numbering for the interlayer 412 is used to describe the formation of the seed layer 404 and bulk layer 408, each seed layer 404 and bulk layer 408 are different structures of the film stack 400. As noted above, the bulk layer 408 can be deposited on the substrate 201, at block 513A to block 513B, in substantially the same manner as the seed layer 404 is formed on the substrate 201 at blocks 509A to 509C.

At block 509C, the temperature of the film stack 400 is reduced. As previously stated, the film stack 400 includes the substrate 201, the seed layer 404, and the bulk layer 408. In one example, the film stack 400 is transferred from the second processing chamber 164 to the first processing chamber 160. The first processing chamber 160 may be maintained at a reduced temperature, when the substrate 201 is cooled in the first processing chamber 160. In another example, the film stack 400 is not transferred to the first processing chamber 160, but is subject to the reduced temperature in the second processing chamber 164. The reduced temperature may be achieved by removing heat from the interior volume 212, e.g., by discontinuing the supply of power to the second power source 284 or chucking the substrate 201 to the electrostatic chuck 238. In some configurations, the film stack 400 may be actively cooled at block 509C. When the film stack 400 is actively cooled, the substrate 201 of the film stack 400 is placed on top of and in direct contact with a temperature regulated body, such as the substrate support 316. Alternatively, the film substrate 201 may be placed on top of and in direct contact with the electrostatic chuck 238. In this configuration, the substrate support 316 or the electrostatic chuck 238 have a temperature lower than the substrate 201, and thus can be used to actively cool the substrate 201. The temperature is reduced for a period time, $\Delta t_{cool}$. The period of time $\Delta t_{cool}$ can be any period of time from about 1 second to about 50 seconds. In one example, the period of time $\Delta t_{cool}$ is between about 10 seconds and 20 seconds. In another example, the period of time $\Delta t_{cool}$ is about 40 seconds. As the period of time $\Delta t_{cool}$ increases, stress (MPa) decreases between the crystal structures in the film stack 400. As stated above, the substrate 201, and therefore the film stack 400, can be cooled in an environment that includes Ar and $N_2$.

Once the seed layer 404 of the film stack 400 reaches a desired thickness by performing one or more of the blocks 509A-509C multiple times, according to the method 500 disclosed herein, the process will continue onto blocks 510 and 512. As illustrated in FIG. 5B, the processes performed in blocks 513A-513C, which are shown within block 512, may be performed sequentially one or more times to form the bulk layer 408. As noted above, the processes performed during blocks 513A-513C will include depositing two or more layers and cooling the substrate using processes similar to the processes described in blocks 509A-509C. Also, as noted above, the two or more film layers formed and processed during the performance of blocks 513A-513C can include using differing process parameters to achieve multiple film layers that have different film thicknesses and/or utilize different process settings to achieve different material properties (e.g., film stress, crystal orientation, electrical properties (e.g., resistivity)) than the two or more layers formed during the performance of blocks 509A-509C. The two or more film layers formed and processed during the performance of blocks 513A-513C may each also have different film thicknesses and/or different material properties.

After blocks 502-512 have been completed, and the film stack 400 is formed, the substrate is then returned to the factory interface 104 by use of a process in which the substrate and film stack 400 is transferred from the first processing chamber 160 to the loading dock 140 by the first robot 132.

Figure 7:
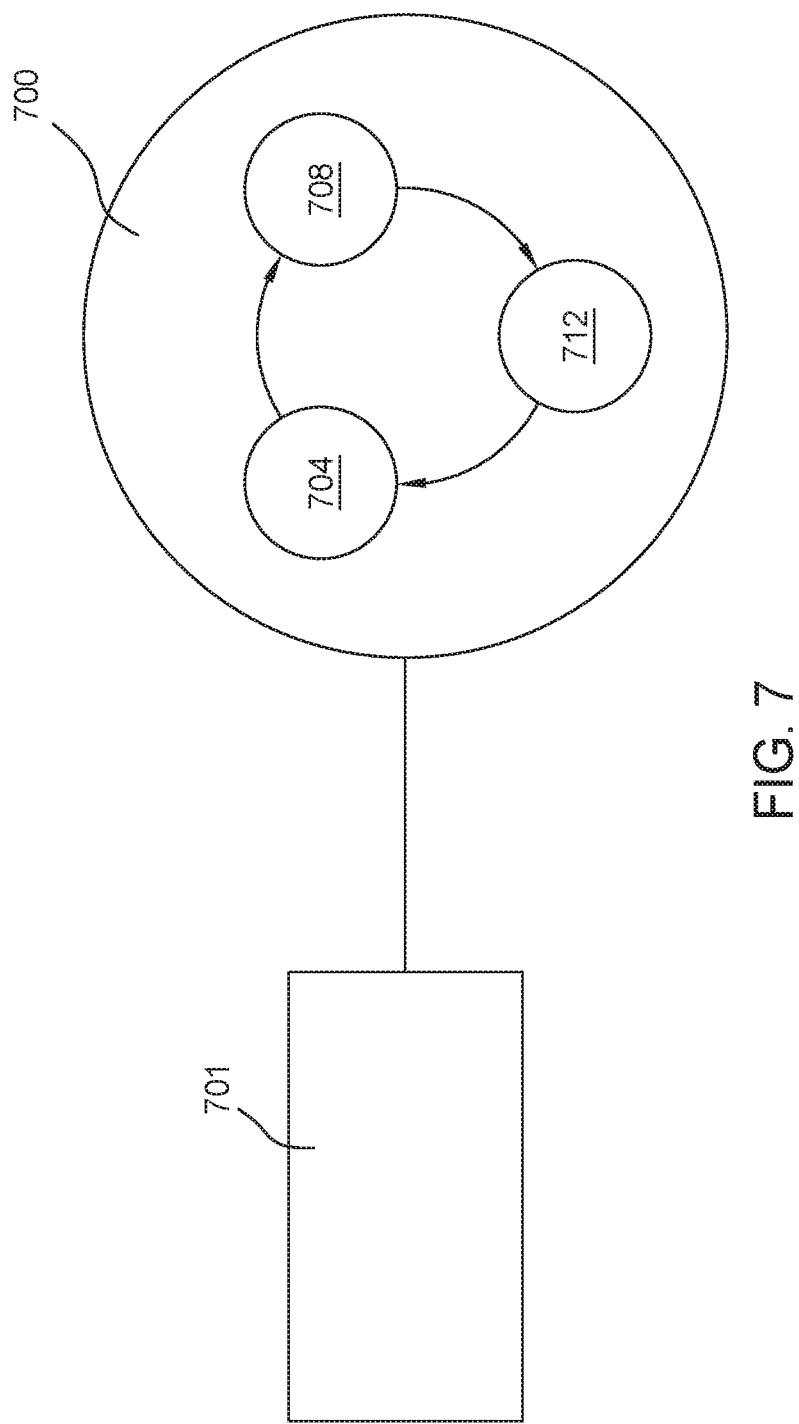
FIG. 7 is a plan view of a controller that can provide instructions to the any one of the processing chambers depicted in FIGS. 1-3.

FIG. 7 is a plan view of a controller 700 that can provide instructions to the any one of the processing chambers depicted in FIGS. 1-3.

An optional display unit 701 may be coupled to the controller 700. The controller 700 includes a processor 704, a memory 708, and support circuits 712 that are coupled to one another. The controller 700 may be on-board the cluster tool 100, or in an alternative example, the controller 700 may be on-board one of the processing chambers in FIG. 2 or 3, or a remote device (not shown).

The display unit 701 includes an input control unit, such as power supplies, clocks, cache, input/output (I/O) circuits, coupled to the various components of the display unit 701 to facilitate control thereof. The processor 704 may be one of any form of general purpose microprocessor, or a general purpose central processing unit (CPU), each of which can be used in an industrial setting, such as a programmable logic controller (PLC).

The memory 708 includes at least one non-transitory computer readable medium and may be one or more of readily available memory such as random access memory (RAM), read only memory (ROM), or any other form of digital storage, local or remote. The memory 708 contains instructions, that when executed by the processor 704 (e.g., central processing unit (CPU), a digital signal processor (DSP), an application-specific integrated circuit (ASIC)), facilitates the operation and processing within of any of the processing chambers illustrated in FIGS. 1-3. The instructions in the memory 708 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure. The program code within memory 708 can be executed by processor 704 in order to perform various processing methods within an apparatus, such as perform one or more of the method steps described in relation to FIG. 5A or 5B to produce a film stack 400 using the various process chambers and supporting components found in the cluster tool 100 illustrated in FIG. 1.

In one example, the controller 700 may be implemented as the program product stored on a computer-readable storage media (e.g. 708) for use with a computer system (not shown). The program(s) of the program product define functions of the disclosure, described herein.

Examples disclosed herein are related to an apparatus and method of forming thin film layers on a substrate. While the foregoing is directed to specific examples of the disclosure, other examples may be devised without departing from the basic scope thereof, and the scope thereof is determined by the claims that follow.

What is claimed is:

1. A method of processing a substrate, comprising:
depositing a first piezoelectric material layer on the substrate in a first processing chamber by use of a physical vapor deposition process, wherein the first piezoelectric material layer is formed on the substrate while the substrate is at a first temperature, and a target used in the physical vapor deposition process comprises aluminum and scandium, wherein depositing the first piezoelectric material layer comprises:
establishing a distance between a surface of the target and a surface of the substrate, the distance being between about 30 mm and 70 mm;
maintaining a bias power between about 20 Watts (W) and about 50 W; and
maintaining a magnetic rotation speed between about 100 rpm and 150 rpm;
after depositing the first piezoelectric material layer, cooling the first piezoelectric material layer and the substrate in a second processing chamber; and
after cooling the first piezoelectric material layer and the substrate, depositing a second piezoelectric material layer on the first piezoelectric material layer at a second temperature, wherein:
the first piezoelectric material layer and the second piezoelectric material layer both comprise a first piezoelectric material, and
the first temperature is between 120° C. and 600° C., and the second temperature is less than or equal to 100° C.

2. The method of processing the substrate as recited in claim 1, further comprising:
depositing a third piezoelectric material layer on top of the second piezoelectric material layer, wherein the third piezoelectric material layer comprises the first piezoelectric material, and the process of depositing the third piezoelectric material layer comprises depositing the third piezoelectric material layer at a different substrate bias than used while depositing the second piezoelectric material layer, wherein each of the first piezoelectric material layer, the second piezoelectric material layer, and the third piezoelectric material layer is formed by a physical vapor deposition process.

3. The method of processing the substrate as recited in claim 1, further comprising:
depositing a third piezoelectric material layer on top of the second piezoelectric material layer, wherein the third piezoelectric material layer comprises the first piezoelectric material, and the process of depositing the third piezoelectric material layer comprises depositing the third piezoelectric material layer at a different pressure used to deposit the second piezoelectric material layer, wherein the second piezoelectric material layer, and the third piezoelectric material layer is performed by use of a physical vapor deposition process.

4. The method of processing the substrate as recited in claim 1, wherein the first piezoelectric material comprises aluminum, scandium, and nitrogen.

5. A method of processing a substrate in a cluster tool, comprising:
depositing a seed layer on a substrate in a first process chamber of the cluster tool by use of a physical vapor deposition process, wherein the seed layer is formed on the substrate while the substrate is at a first temperature, and a target used in the physical vapor deposition process comprises aluminum and scandium, wherein depositing the seed layer comprises:
establishing a distance between a surface of the target and a surface of the substrate, the distance being between about 30 mm and 70 mm;
maintaining a bias power between about 20 Watts (W) and about 50 W; and
maintaining a magnetic rotation speed between about 100 rpm and 150 rpm;
after depositing the seed layer, cooling the seed layer and the substrate the seed layer and the substrate in a second processing chamber of the cluster tool; and
after cooling the seed layer and the substrate, depositing a first piezoelectric material layer on the seed layer, after cooling the substrate to a second temperature, wherein:
the seed layer and the first piezoelectric material layer both comprise a first material, and
the first temperature is between 120° C. and 600° C., and the second temperature is less than or equal to 100° C.

6. The method of processing the substrate as recited in claim 5, further comprising:
exposing a surface of the substrate to a plasma before depositing the seed layer.

7. The method of processing the substrate as recited in claim 5, the method further comprises:
depositing a second piezoelectric material layer on top of the first piezoelectric material layer, wherein the second piezoelectric material layer comprises the first material, and the process of depositing the second piezoelectric material layer comprises depositing the second piezoelectric material layer at a different substrate bias than used while depositing the first piezoelectric material layer, wherein each of the seed layer, the first piezoelectric material layer, and the second piezoelectric material layer is formed by a physical vapor deposition process.

8. The method of processing the substrate as recited in claim 5, the method further comprises:
depositing a second piezoelectric material layer on top of the first piezoelectric material layer, wherein the second piezoelectric material layer comprises the first material, and the process of depositing the second piezoelectric material layer comprises depositing the second piezoelectric material layer at a different pressure or substrate bias than used to deposit the first piezoelectric material layer, wherein the process of depositing the seed layer and the first piezoelectric material layer is performed by use of a physical vapor deposition process performed.

* * * * *